(12) United States Patent
Voutsas

(10) Patent No.: US 6,911,666 B2
(45) Date of Patent: Jun. 28, 2005

(54) FLEXIBLE METAL FOIL SUBSTRATE DISPLAY AND METHOD FOR FORMING SAME

(75) Inventor: Apostolos T. Voutsas, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 46 days.

(21) Appl. No.: 10/282,744

(22) Filed: Oct. 28, 2002

(65) Prior Publication Data

US 2004/0087066 A1 May 6, 2004

Related U.S. Application Data

(63) Continuation-in-part of application No. 10/194,895, filed on Jul. 11, 2002, now Pat. No. 6,642,092.

(51) Int. Cl.[7] .............................................. H01L 29/06
(52) U.S. Cl. ............................ 257/40; 257/288; 438/30
(58) Field of Search ................... 257/E51.026, E51.01, 257/E51.02, E51.05, E51.011, 40

(56) References Cited

U.S. PATENT DOCUMENTS

| | | | |
|---|---|---|---|
| 5,707,745 A | 1/1998 | Forrest et al. .............. 428/432 |
| 5,739,545 A | 4/1998 | Haight et al. | |
| 6,150,668 A | * 11/2000 | Bao et al. ..................... 257/40 |
| 6,262,441 B1 | 7/2001 | Bohler et al. | |
| 6,384,427 B1 | 5/2002 | Yamazaki et al. ............ 257/59 |
| 6,392,617 B1 | 5/2002 | Gleason ....................... 345/82 |
| 6,420,834 B2 | 7/2002 | Yamazaki et al. ....... 315/169.3 |
| 6,433,358 B1 | 8/2002 | Beierlein | |
| 6,590,346 B1 | * 7/2003 | Hadley et al. ........... 315/169.3 |
| 6,765,249 B2 | * 7/2004 | Voutsas et al. ............. 257/288 |
| 2001/0000005 A1 | 3/2001 | Forrest et al. ......... 204/192.12 |
| 2001/0026125 A1 | 10/2001 | Yamazaki et al. .......... 313/505 |
| 2001/0055841 A1 | 12/2001 | Yamazaki et al. .......... 438/151 |
| 2002/0018060 A1 | 2/2002 | Yamazaki et al. .......... 345/211 |

(Continued)

FOREIGN PATENT DOCUMENTS

| | | | |
|---|---|---|---|
| EP | 1179862 | 2/2002 | ........... H01L/51/20 |
| EP | 1227528 | 7/2002 | ........... H01L/51/20 |
| WO | WO0016361 | 3/2000 | ............ H01J/1/62 |
| WO | WO0115244 | 3/2001 | ........... H01L/35/24 |
| WO | WO0124290 | 4/2001 | ........... H01L/51/20 |
| WO | WO0167825 | 9/2001 | ........... H01L/51/26 |

OTHER PUBLICATIONS

Wu et al., "Integration of Organinc LED's and Amorphous Si TFT's onto Unbreakable Metal Foil Substrates" IEEE, IEDM 1996, pp 957–959.*

T. Serikawa and F. Omata, IEEE Electron Dev. Lett., 20, 574 (1999).

M. Wu and S. Wagner, Mat. Res. Soc. Symp. Proc., 2001.

*Primary Examiner*—W. David Coleman
(74) *Attorney, Agent, or Firm*—David C. Ripma; Matthew D. Rabdau; Joseph P. Curtin

(57) ABSTRACT

A flexible metal foil substrate organic light emitting diode (OLED) display and a method for forming the same are provided. The method comprises: supplying a metal foil substrate such as titanium (Ti), Inconel alloy, or Kovar, having a thickness in the range of 10 to 500 microns; planarizing the metal foil substrate surface; depositing an electrical isolation layer having a thickness in the range of 0.5 to 2 microns overlying the planarized metal foil substrate surface; depositing amorphous silicon having a thickness in the range of 25 to 150 nanometers (nm) overlying the electrical insulation layer; from the amorphous silicon, forming polycrystalline silicon overlying the electrical insulation layer; forming thin-film transistors (TFTs) in the polycrystalline silicon; and, forming an electronic circuit using the TFTs, such as an OLED display.

24 Claims, 7 Drawing Sheets

U.S. PATENT DOCUMENTS

| | | | |
|---|---|---|---|
| 2002/0024051 A1 | 2/2002 | Yamazaki et al. | 257/79 |
| 2002/0030193 A1 | 3/2002 | Yamazaki et al. | 257/98 |
| 2002/0036297 A1 | 3/2002 | Pichler | |
| 2002/0044208 A1 | 4/2002 | Yamazaki et al. | 348/272 |
| 2002/0053669 A1 | 5/2002 | Suzawa et al. | 257/59 |
| 2002/0098346 A1 | 7/2002 | Yitchaik | 428/339 |
| 2002/0113549 A1 | 8/2002 | Yamazaki et al. | 313/506 |
| 2002/0117663 A1 | 8/2002 | Beierlein | |
| 2002/0134979 A1 | 9/2002 | Yamazaki et al. | 257/59 |
| 2003/0228715 A1 * | 12/2003 | Brody et al. | 438/30 |

* cited by examiner

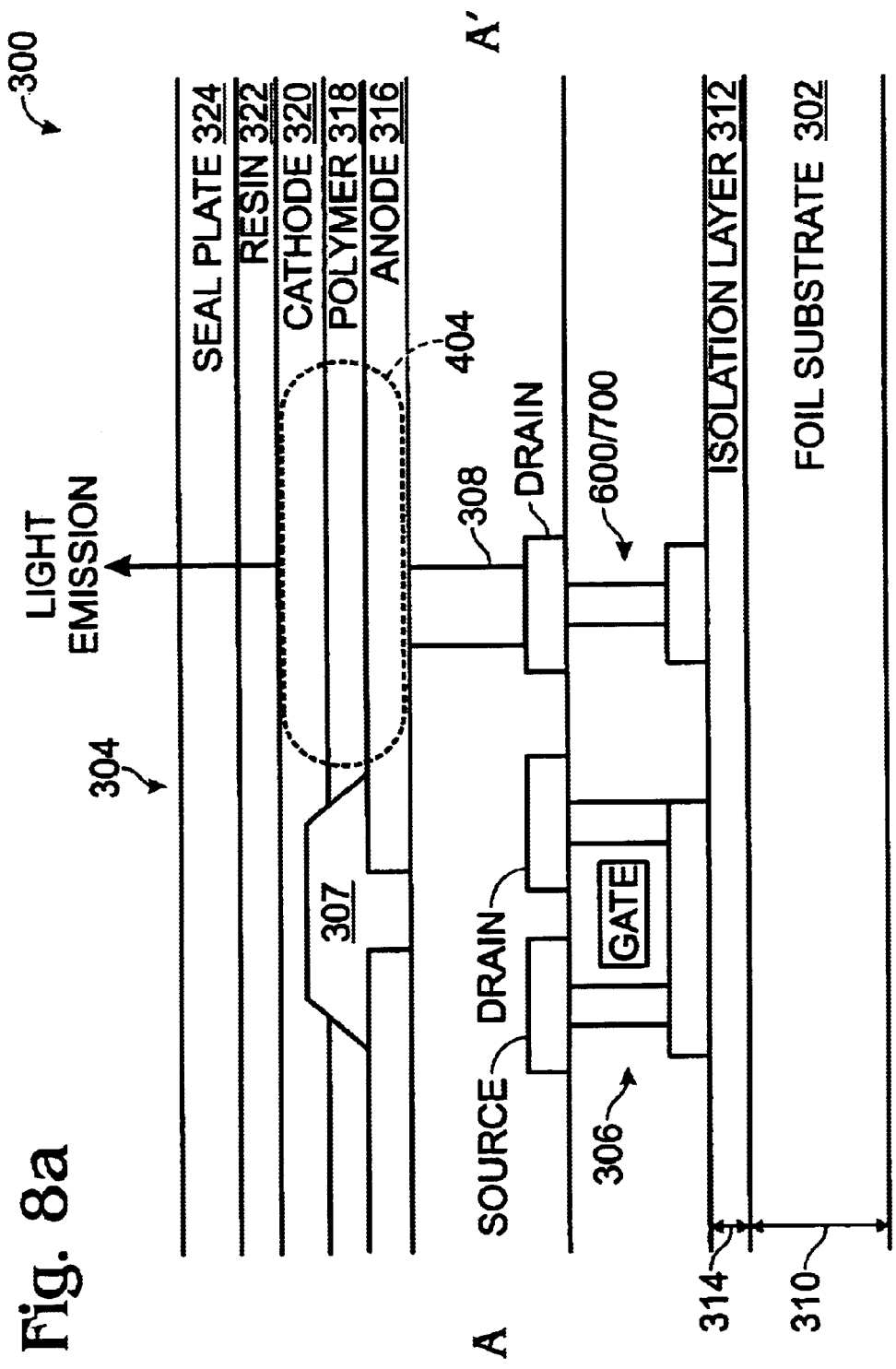

FIRST PIXEL

FLEXIBLE METAL FOIL SUBSTRATE DISPLAY AND METHOD FOR FORMING SAME

RELATED APPLICATIONS

This application is a continuation-in-part of a patent application entitled, THIN-FILM TRANSISTORS FORMED ON A METAL FOIL SUBSTRATE, invented by Voutsas et aL, Ser. No. 10/194,895, filed Jul. 11, 2002 Now U.S. Pat. No. 6,642,092.

BACKGROUND OF THE INVENTION

1. Field of the Invention

This invention generally relates to organic light emitting diode (OLED) displays and, more particularly, to an OLED display fabricated on a thin metal foil substrate.

2. Description of the Related Art

As noted in U.S. Pat. No. 6,392,617 (Robert Gleason), arrays of OLEDs are utilized to create two-dimensional flat panel displays. As compared to conventional light emitting diodes (LEDs), which are made of compound semiconductors, the low cost and ease of patterning OLEDs makes compact, high resolution arrays practical. OLEDs can be adapted to create either monochrome or color displays and the OLEDs are conventionally formed on glass or semiconductor substrates.

As is known in the art, arrays of OLEDs and LEDs are typically classified as passive matrix arrays or active matrix arrays. In a passive matrix array, the current drive circuitry is external to the array, and in an active matrix array the current drive circuitry includes one or more transistors that are formed within each pixel. An advantage of active matrix arrays is that they do not require peak currents that are as high as passive matrices. High peak currents are generally undesirable because they reduce the luminous efficiency of available OLEDs. Because the transparent conducting layer of an active matrix can be a continuous sheet, active matrix arrays also mitigate voltage drop problems that are experienced in the patterned transparent conductors of passive matrices.

FIGS. 1 and 2 are depictions of conventional active matrix pixels (prior art). It should be understood that although individual active matrix pixels are shown for description purposes, the individual active matrix pixels shown in these figures are typically part of an array of pixels that are located closely together in order to form a display. As shown in FIGS. 1 and 2, each of the active matrix pixels includes an address (gate) line 102 and 202, a data line 104 and 204, an address transistor 106 and 206, a drive transistor 108 and 208, a storage node 110 and 210, and an OLED 112 and 212. The address lines allow the pixels to be individually addressed and the data lines provide the voltage to activate the drive transistors. The address transistors control the writing of data from the data lines to the storage nodes. The storage nodes are represented by capacitors, although they need not necessarily be separate components, as the gate capacitance of the drive transistors and the junction capacitance of the address transistors may provide sufficient capacitance for the storage nodes. As shown, the OLEDs are connected to a drive voltage ($V_{LED}$) and the current that flows through the OLEDs is controlled by the drive transistors. When current is allowed to flow through the drive transistors, the OLEDs give off light referred to as a luminous flux, as indicated by the arrows 114 and 214.

Referring to FIG. 1, PMOS transistors are preferred when the cathode of the OLED 112 is grounded, and referring to FIG. 2, NMOS transistors are preferred when the anode of the OLED 212 is connected to the supply voltage ($V_{LED}$). Utilizing the PMOS and NMOS transistors as shown in FIGS. 1 and 2 makes the gate to source voltages of the drive transistors 108 and 208 insensitive to voltage drops across the OLEDs, thereby improving the uniformity of the light 114 and 214 that is given off by the OLEDs.

The operation of the prior art active matrix pixels is described with reference to the active matrix pixel configuration shown in FIG. 2, although the same concepts apply to the active matrix pixel of FIG. 1. The active matrix pixel shown in FIG. 2 serves as an analog dynamic memory cell. When the address line 202 is high, the data line 204 sets the voltage on the storage node 210, which includes the gate of the drive transistor 208. When the voltage on the storage node exceeds the threshold voltage of the drive transistor, the drive transistor conducts causing the OLED 212 to emit light 214 until the voltage on the storage node drops below the threshold voltage of the drive transistor, or until the voltage on the storage node is reset through the address transistor 206. The voltage on the storage node will typically drop due to leakage through the junction of the address transistor and through the gate dielectric of the drive transistor. However, with sufficiently low leakage at the address and drive transistors and high capacitance at the storage node, the current through the OLED is held relatively constant until the next voltage is set on the storage node. For example, the voltage is typically reset at a constant refresh interval as is known in the art. The storage node is represented as a capacitor in order to indicate that sufficient charge must be stored on the storage node to account for leakage between refresh intervals. As stated above, the capacitor does not necessarily represent a separate component because other sources of capacitance on the storage node may suffice.

In the active matrix pixel of FIG. 2, the voltage on the storage node 210 determines the intensity of the light 214 that is generated by the OLED 212. If the intensity-current relationship of the OLED and gate voltage-current relationship of the drive transistor 208 are known, according to one method, the desired intensity of light is generated by placing the corresponding voltage on the storage node. Setting the voltage on the storage node is typically accomplished by utilizing a digital to analog converter to establish the voltage on the corresponding data line 204. In an alternative method, the storage node is first discharged by grounding the data line, and then the data line is set to the CMOS supply voltage ($V_{dd}$). Utilizing the latter method, the address transistor 202 functions as a current source, charging the storage node until the storage node is isolated by setting the address line low. The latter method offers the benefit of not requiring a digital to analog converter on each data line. However, one disadvantage of the latter method is that the storage node capacitance within a single pixel is a non-linear function of the voltage when supplied by the gates and junctions of the transistors. Another disadvantage is that the storage node capacitance of each pixel varies among the pixels in an array.

As described above, in order to obtain the desired luminous flux from the OLED 212 of FIG. 2, the voltage on the data line 204 is adjusted to control the current through the drive transistor 208. Unfortunately, current flow through the drive transistor also depends on characteristics of the drive transistor, such as its threshold voltage and transconductance. Large arrays of drive transistors, as required to make a high-resolution display, exhibit variations in threshold voltage and transconductance that often cause the drive currents of the OLEDs to differ for identical control voltages. These variations, in turn, cause a display to appear non-uniform. In addition, different OLEDs emit different intensities of light even when driven with identical currents. Furthermore, the light intensity for a specified drive current drops as an OLED ages and different OLEDs can degrade at different rates, again causing a display to appear non-uniform.

Active matrix pixels are preferably implemented with a silicon substrate instead of a transparent dielectric substrate because transparent dielectric substrates require the transistors to be built as thin film devices. It is difficult to obtain a tight distribution of threshold voltages in large arrays of thin-film transistors, especially as more transistors are needed to make the luminous flux from each pixel insensitive to threshold variations. For this reason, OLED displays are often fabricated on a glass substrate. However, if a silicon substrate is used, addressing, driving, and other circuit functions can be easily integrated, particularly if the substrate and process are compatible with CMOS technology. Although known active matrix pixel technology is compatible with older CMOS technology, OLEDs require higher voltages than dense CMOS can tolerate, while dense CMOS is desirable for the small pixels that are required for high-resolution color displays.

As mentioned above, glass substrates are predominantly used in the fabrication of liquid-crystal and OLED displays. One major disadvantage of glass is that it is fragile. Hence, glass-made displays are not very robust and they tend to break upon impact. A glass substrate is also sensitive to heat, which imposes a limit on the maximum temperature that it can be exposed at during processing. Furthermore, future applications, which may demand some degree of conformability/flexibility in the display, that cannot be readily satisfied with displays fabricated on glass.

Polysilicon (poly-Si) technology has started penetrating the market of smaller displays, such as displays used for personal-digital-assistants (PDAs), cellular phones, car navigation systems, etc. With current technology, thin poly-Si films are typically formed by the deposition of amorphous silicon films and subsequent transformation to polycrystalline silicon upon a suitable thermal treatment. The maximum temperature and the duration of such thermal treatment are constrained by the thermal budget that the substrate can accommodate, before it breaks or it is otherwise damaged.

Glass substrates are generally restricted to processing temperatures below ~650° C. Higher temperatures, up to approximately 725° C., can possibly be used without damage, but only for very short periods. This low temperature constraint results in poorer quality poly-Si films, which are not compatible with the fabrication of high performance devices and circuits. An alternative approach is to induce the phase transformation is by laser annealing the film, using excimer lasers for example. This process results in very rapid heating of the film, affecting the phase transformation without excessively heating the underlying substrate. Even though the laser annealing process is quite effective, it tends to be more costly than simply heating the film by conventional means.

Another important step in the fabrication of the displays is deposition of gate insulator (GI) layer. In the semiconductor industry, such films are typically formed by thermal oxidation at high temperatures (>1000° C.) to ensure high quality films. However, these high temperatures cannot used when the substrates are made of glass. Hence, a compromise in the quality of the GI layer is typically required for devices made on glass.

It would be advantageous to identify substrates which are more robust than glass, and that permit the fabrication of conformable/flexible displays.

It would also be advantageous if displays, which are built on the above-mentioned substrates, could be made compatible with higher processing temperatures. In that case, higher quality poly-Si material could be obtained, compatible with the fabrication of high performance devices and circuits.

SUMMARY OF THE INVENTION

The present invention describes a method and process for the fabrication of displays on robust substrates made of metal foils. The invention describes the use of metal foil substrates for the fabrication of poly-Si TFT backplanes, and also the processes that can be used for the fabrication of high quality poly-Si TFT transistors. The processes involve the combination of conventional solid-phase-crystallization and thermal oxidation GI formation at the high temperatures, which is permitted with the use of metal foil substrates.

Accordingly, a method is provided for forming an electronics circuit on a flexible substrate. The method comprises: supplying a metal foil substrate such as titanium (Ti), Inconel alloy, or Kovar, having a thickness in the range of 10 to 500 microns; planarizing the metal foil substrate surface; depositing an electrical isolation layer having a thickness in the range of 0.5 to 2 microns overlying the planarized metal foil substrate surface; depositing amorphous silicon having a thickness in the range of 25 to 150 nm overlying the electrical insulation layer; from the amorphous silicon, forming polycrystalline silicon overlying the electrical insulation layer; forming thin-film transistors (TFTs) in the polycrystalline silicon; and, forming an electronic circuit using the TFTs, such as an OLED display.

Additional details of the above-described method and a flexible substrate, active matrix (AM), top emission OLED display are provided below.

BRIEF DESCRIPTION OF THE DRAWINGS

FIG. 8a is a partial cross-sectional view of the present invention flexible substrate OLED display of FIG. 8b, with two TFTs per pixel.

DETAILED DESCRIPTION OF THE PREFERRED EMBODIMENTS

Figure 3:
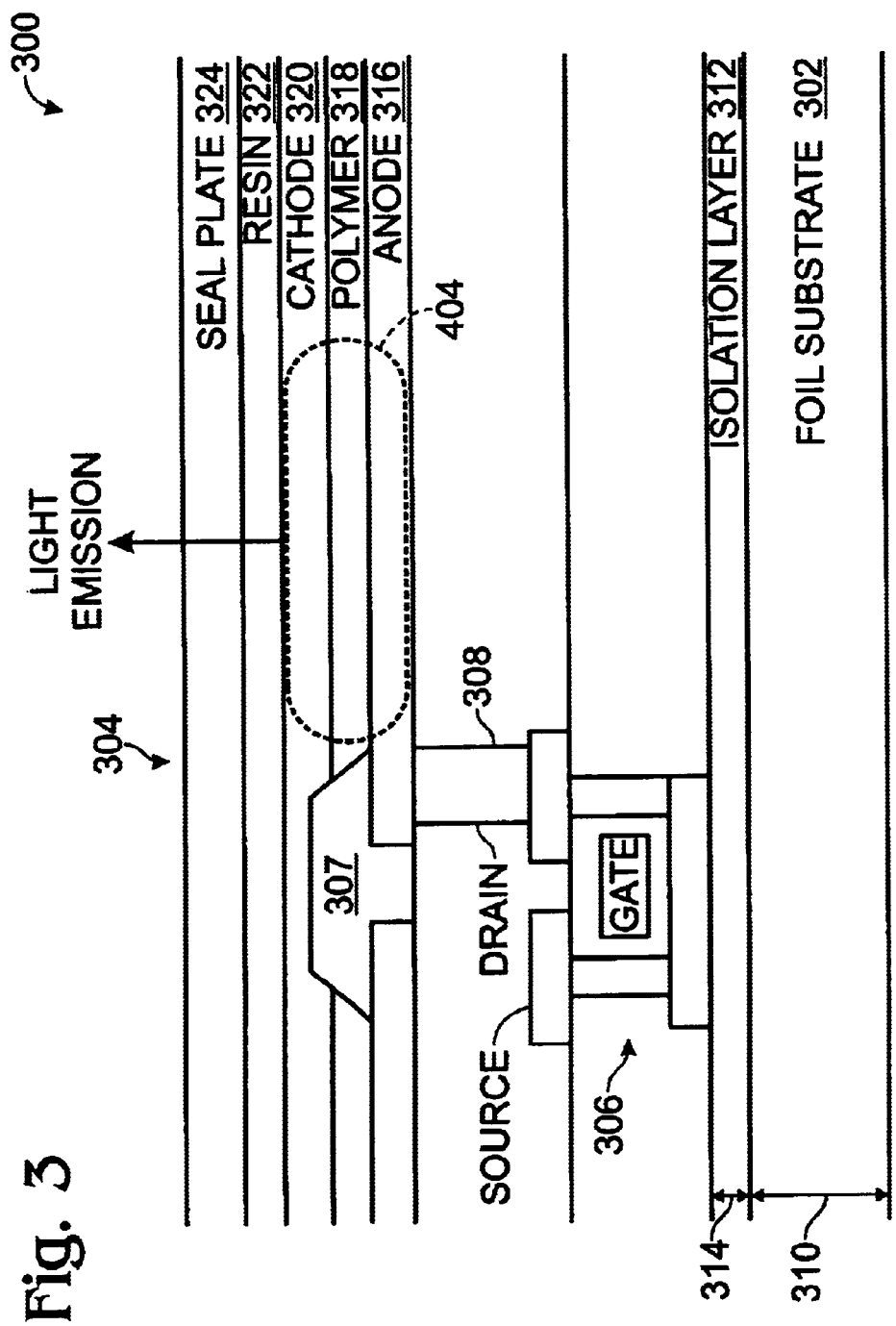
FIG. 3 is a partial cross-sectional view of the present invention flexible substrate, active matrix (AM), top emission organic light-emitting diode (OLED) display.

FIG. 3 is a partial cross-sectional view of the present invention flexible substrate, active matrix (AM), top emission organic light emitting diode (OLED) display. The display 300 comprises a metal foil substrate 302 and a plurality of pixels areas. For simplicity, a single pixel area 304 is shown. Each pixel area, including pixel area 304, includes at least one thin-film transistor (TFT) 306 overlying the substrate. The pixel area 304 is isolated with an isolation material 307.

Figure 4:
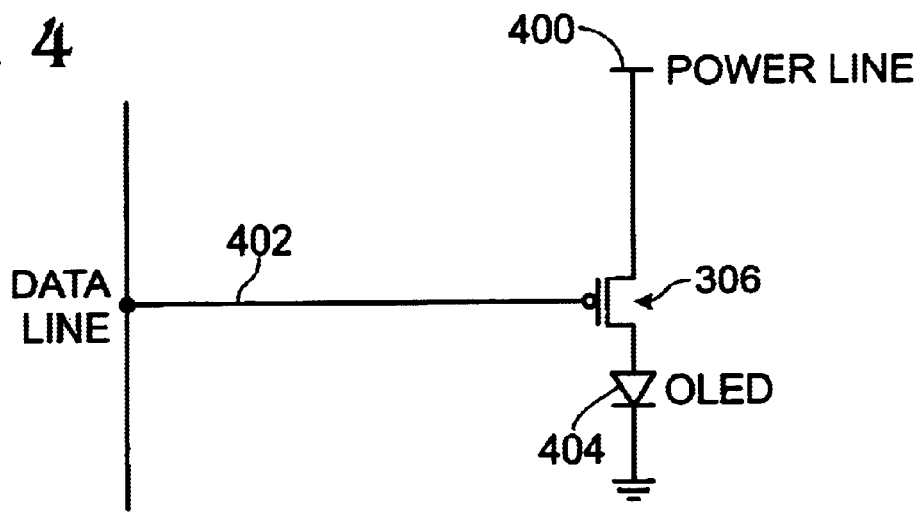
FIG. 4 is a schematic block diagram of the OLED display of FIG. 3, using a PMOS FET transistor.

FIG. 4 is a schematic block diagram of the OLED display of FIG. 3, using a PMOS FET transistor. As shown, first TFT 306 has a drain electrode connected to a power line 400, a gate electrode connected to a data line 402, and a source connected to the anode of an OLED 404. The cathode of the OLED 404 is connected to ground (or a voltage potential lower than the power line). As mentioned in the Background Section, PMOS transistors are typically used when the cathode of the LED 404 is grounded. The power line 400 supplies a predetermined, constant voltage. That is, the powerline supplies a dc voltage.

Figure 5:
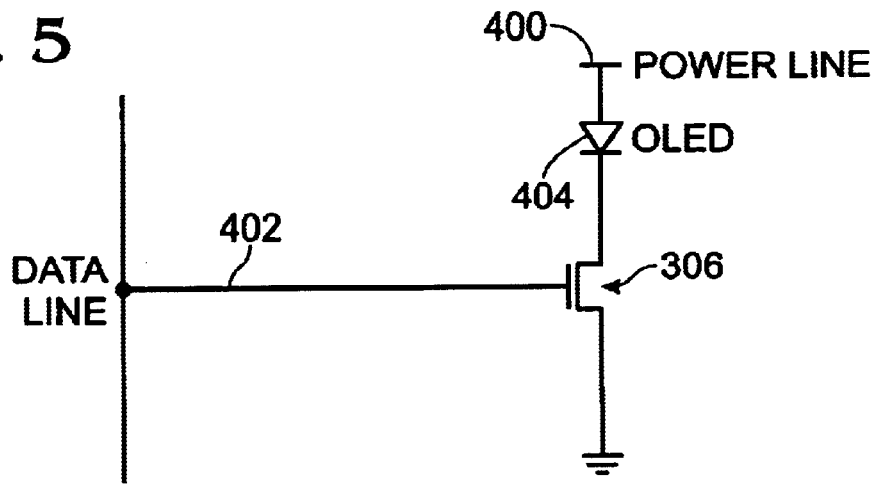
FIG. 5 is a schematic block diagram of the OLED display of FIG. 3, using an NMOS FET transistor.

FIG. 5 is a schematic block diagram of the OLED display of FIG. 3, using an NMOS FET transistor. As shown, first NMOS TFT 306 has a drain electrode connected to the cathode of the OLED 404, a gate electrode connected to a data line 402, and a source connected to ground.

Returning to FIG. 3, an OLED 404, shown enclosed with dotted lines, overlies the first TFT 306 and is connected to the first TFT 306 through a via 308. The metal foil substrate 302 is a material such as (Ti), Inconel alloy, stainless steel, or Kovar. In one aspect of the display, the metal foil substrate 302 has a thickness 310 in the range of 10 to 500 microns. Preferably, the metal foil substrate 302 has a thickness 310 in the range of 50 to 250 microns. Most preferably, the metal foil substrate 302 has a thickness 310 in the range of 100 to 200 microns. Thinner substrates make for a more flexible display.

Typically, the OLED display 300 further comprises an isolation layer 312 interposed between the metal substrate 302 and the pixel area 304. In some aspects, the isolation layer 312 is SiO2 and has a thickness 314 of approximately 1 micron. However, alternate isolation layer materials are available.

Connections can be enabled to the conductive substrate 302 using an additional masking step. The metal substrate 302 is typically covered with a one-micron thick SiO2 film to ensure optimal electrical isolation and maximum barrier properties against the diffusion of metal contaminants. Making contact to the substrate, therefore, involves etching through this thick oxide film. To accomplish this etching, a masking step can be applied after the definition of poly-Si islands, with the aim of defining these deep vias. Other possibilities to accomplish the connection to the substrate are possible, however.

In some aspects, the OLED 404 includes a metal anode 316 overlying the first TFT 306 and connected to the first TFT 306 source through the via 308, see FIG. 4. An organic polymer layer 318 overlies the metal anode 316, and a semi-transparent cathode 320 overlies the organic polymer layer 318.

In other aspects, metal layer 316 is the cathode of the OLED 404. see FIG. 5. Then, the organic polymer layer 318 overlies the metal cathode 316, and a semi-transparent anode 320 overlies the organic polymer layer 318. In either aspect, a resin layer 322 overlies the pixels, and a seal plate 324 overlying the resin layer 322.

The fabrication process for the OLED display 300 typically starts with the fabrication of the TFT backplane. This process is very similar to that of a liquid crystal display (LCD) device. The main difference lies in the configuration of the thin-film transistors in the pixel. In the case of OLEDs, good uniformity in TFT characteristics is more critical than in the case of LCDs. This stems primarily by the fact that the light emitted from a pixel is directly proportional to the current of the pixel-driving TFT as follows:

Light $\infty$ Drive Current $\infty$ $\mu \cdot (V_G - V_{th})^2$ where $\mu$ is a factor related to electron mobility.

Increasing the TFT mobility makes a pixel brighter, while increasing the TFT threshold voltage makes a pixel darker. Significant variations from pixel-to-pixel make a commercial display product unacceptable. Such brightness variations can be minimized, either by reducing the intrinsic variability in TFT characteristics, and/or by employing pixel-driving schemes that compensate for such variability. In accordance to the latter, multiple-TFT pixel-driving schemes aim to compensate for variations in the intrinsic characteristics of individual TFTs.

Figure 1:
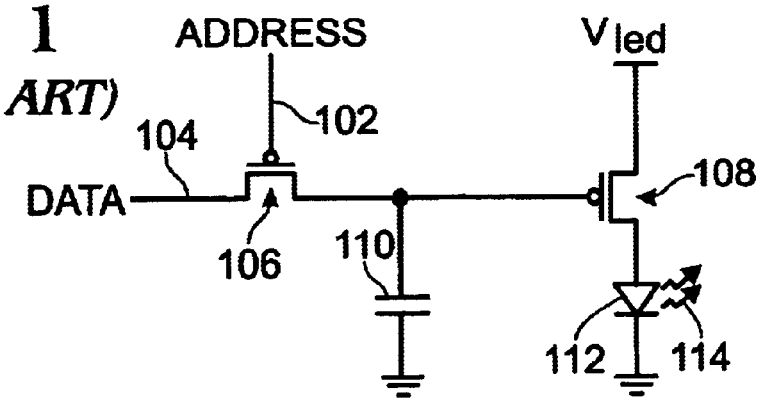
FIGS. 1 and 2 are depictions of conventional active matrix pixels (prior art).
Figure 2:
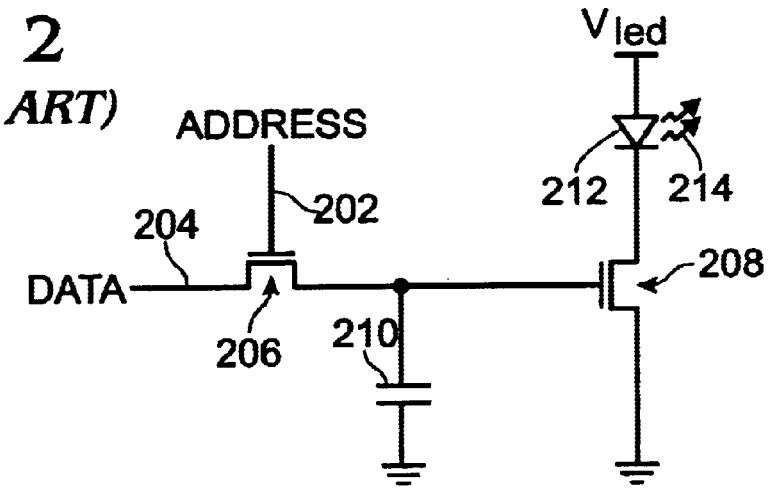

Beyond the brightness uniformity issue, single-TFT pixel architecture suffers from another problem. In the approach of FIG. 3 or FIG. 4, each pixel is pulsed ON for a fraction of the frame time (=1/number of gate lines). This requires the peak OLED current to be much higher than the average current, leading to a faster degradation of the OLED material. To avoid such high current pulses, designs involving 2-TFT pixels have been developed, as shown in FIGS. 1 and 2. These designs enable pixel "memory". The memory permits the pixel to deliver a small current throughout the entire frame period. In this manner, even though the average current through the OLED material is the same, the peak current is greatly reduced, which leads to increased brightness and longer OLED lifetime. Other more elaborate, 4-TFT pixel designs have also been proposed to improve brightness uniformity by correcting for variations in the threshold voltage and mobility of the TFTs. However, 2-TFT pixel designs appear to be the best comprise between quality and production costs. The following variations of the invention are based on such a design. Starting with the limitations of a 2-TFT pixel design, further improvements in brightness uniformity are a result of process improvements.

Figure 6:
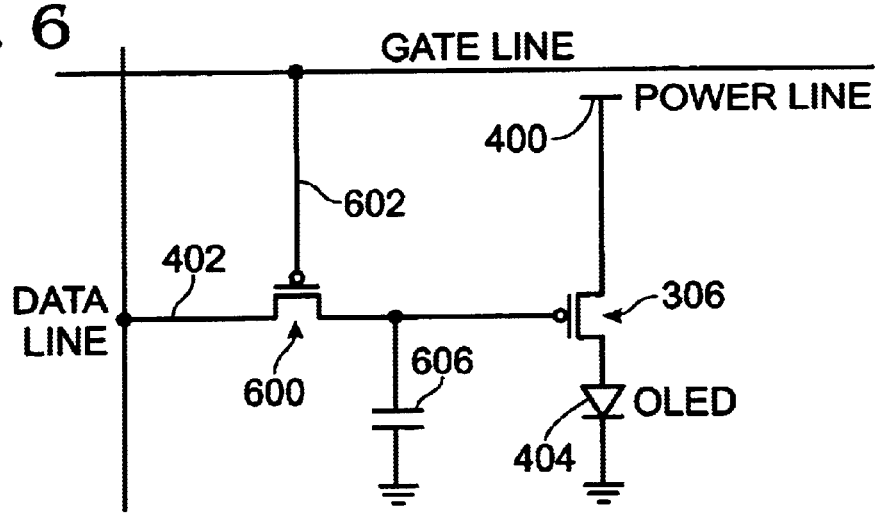
FIG. 6 is a schematic block diagram of the OLED display of FIG. 3 using two PMOS transistors.

FIG. 6 is a schematic block diagram of the OLED display of FIG. 3 using two PMOS transistors. The second (PMOS) TFT 600 has a gate electrode connected to a gate line 602 and a source electrode connected to the data line 402. The first PMOS TFT 306 has a drain electrode connected to the power line 400, as source connected to the anode of an OLED 404, and a gate electrode connected to the drain of the second TFT 600. The cathode of the OLED 404 is connected to ground.

In some aspects, each pixel further includes a storage capacitor 606 connected between the drain electrode of the second TFT 600 and the gate electrode of the first TFT 306. In other aspects, the power line 400 is the metal foil substrate (see FIG. 3, reference designator 302). The drain of each pixel second TFT 600 is connected to the substrate through a connection that can either be a single via or a plurality of vias.

Figure 7:
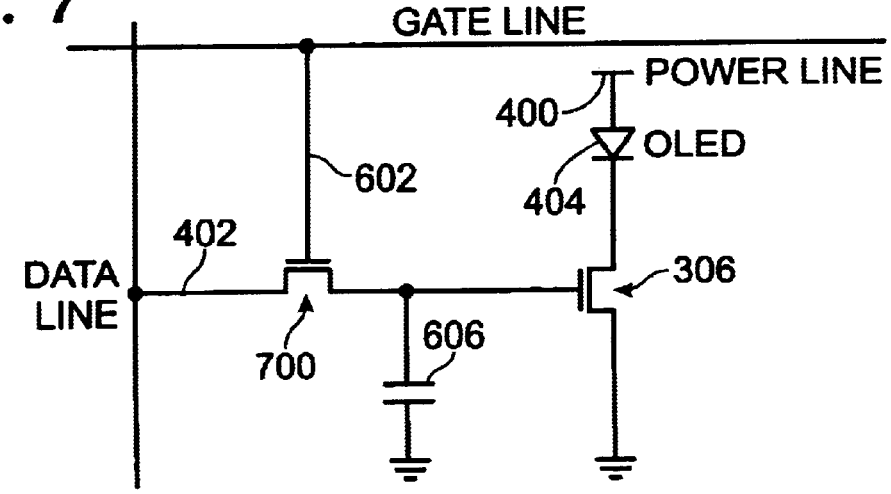
FIG. 7 is a schematic block diagram of the OLED display of FIG. 3 using two NMOS transistors.

FIG. 7 is a schematic block diagram of the OLED display of FIG. 3 using NMOS transistors. The second (NMOS) TFT 700 has a gate electrode connected to a gate line 602 and a source electrode connected to the data line 402. The first (NMOS) TFT 306 has a drain electrode connected&to the cathode of an OLED 404, a gate electrode connected to the drain of the second TFT 700, and a source connected to a ground. The anode of the OLED 404 is connected to the power line 400.

In some aspects, each pixel further includes a storage capacitor 606 connected between the drain electrode of the second TFT 700 and the gate electrode of the first TFT 306. In other aspects, the power line 400 is the metal foil substrate (see FIG. 3, reference designator 302). The drain of each pixel second TFT 700 is connected to the substrate through a connection that can either be a single via or a plurality of vias.

Conventionally in 2-TFT pixel designs, there are three connecting lines to the pixel FETs. Two lines are the data line and gate line buses. The third line (the power line) supplies an additional constant voltage to the first FET source (FIG. 6) or OLED anode (FIG. 7). The real estate associated with this third line contributes additionally to the reduction of the pixel aperture ratio. Hence, it would be desirable to eliminate this line. One opportunity to do this is presented in the case of a conductive substrate, such as a metal foil. Then, the source of the first FET (FIG. 6) or anode of the OLED (FIG. 7) is directly connected to the conductive substrate, which is held at the appropriate, constant voltage (i.e. 2–7V). By doing so, the aperture ratio is improved without sacrificing pixel functionality. For clarity, the storage capacitor has been omitted from this drawing.

Figure 8B:
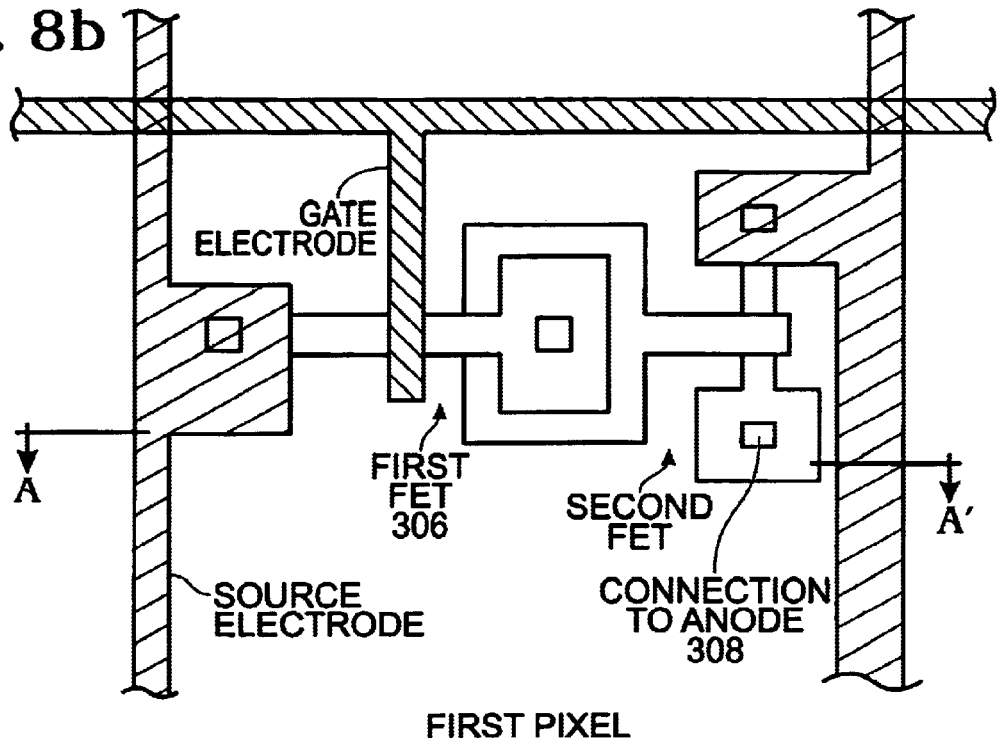
FIG. 8b is a multilevel plan view of the present invention flexible substrate OLED display, with two TFT's per pixel.

FIG. 8a is a partial cross-sectional view of the present invention flexible substrate OLED display of FIG. 8b, with two TFTs per pixel.

FIG. 8b is a multilevel plan view of the present invention flexible substrate OLED display, with two TFT's per pixel.

Figure 9:
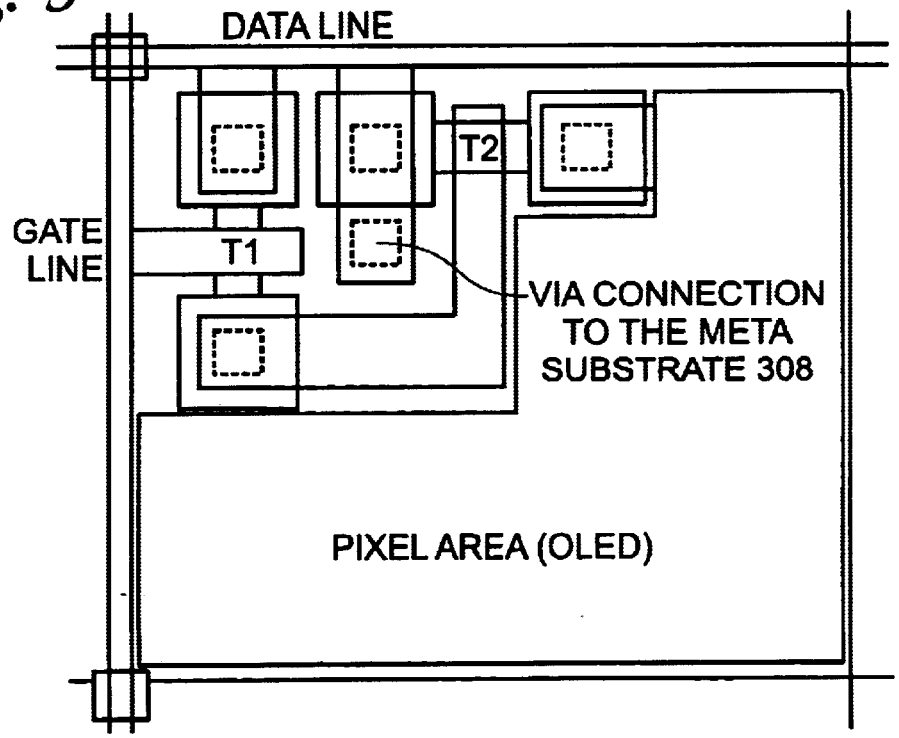
FIG. 9 is a plan view of the circuit of either FIG. 6 or FIG. 7.

FIG. 9 is a plan view of the circuit of either FIG. 6 or FIG. 7. Shown is a single via 800 connected to the drain of the second TFT 604/702. T1 is first TFT 306 and T2 is either second TFT 600 (FIG. 6) or second TFT 700 (FIG. 7). Note that the placement of the TFTs, via(s), TFT interconnects, and the OLED is merely exemplary, as other placements are also possible. It should be noted that although only one and two-TFT pixel designs have been explicitly described above, the present invention concepts could be extrapolated to other designs, such as four-TFT pixels, by those skilled in the art.

FUNCTIONAL DESCRIPTION

There are two variations in OLEDs, just as there are types of LCDs. There are "passive matrix" OLEDs and "active matrix" OLEDs (so-called AM-OLEDs). TFT technology is especially relevant to AM-OLEDs. In that case, as with AM-LCDs, the state of each OLED pixel is individually controlled by TFT devices within the pixel. As mentioned above, a greater number of TFTs result in greater pixel brightness uniformity. Uniformity is process-specific, for example, depending upon the crystallization technology that is used to make the poly-Si material. The present invention, by adopting new process technology, achieves adequate pixel uniformity with a reduced number of FETs per pixel. A lower number of TFTs per pixel results in a simpler process, better yield (in other words, lower cost), and improved aperture ratio for the display, as the transparent area of the pixel increases when the number of components decreases.

There is one more classification relevant to OLEDs: "bottom emission" vs. "top emission" OLEDs, referring to the direction that light is emitted. In the former case, light is emitted from the "bottom" of the device, through the substrate. In the latter case, light is emitted through the top of the device, through the top substrate. When an opaque substrate such as metal foil is used, only a top emission OLED is practical. Top emission OLEDs have several advantages over bottom-emission OLEDs:

(1) Higher aperture ratio. This is especially true when considering pixel architectures using more than 2 TFTs. In these cases the aperture ratio of bottom emission OLEDs is too low for practical, high-resolution displays;

(2) Better color purity. Color purity is important in applications that require very clear color, such as TVs;

(3) All solid-stage package structure. The thickness of the module decreases, providing better packaging economics. A bottom emission OLED requires a moisture control means, as the OLED is exposed. This moisture control is typically accomplished by adding desiccant in the array, increasing the array package thickness. Since the OLED layer in a top emission OLED is already covered, there is a reduced need for desiccant. Thus, top emission packaging is freer of void spaces, and the packaging has a reduced overall thickness.

One critical element in top emission OLED devices is the semi-transparent cathode/anode materials. Furthermore, the deposition process for such materials must to be non-intrusive to the very sensitive OLED layers, in order to minimize damage to the OLED layers. Damage to the OLED layers causes substantial reduction in the brightness and lifetime of the OLED. The OLED layers are typically polymer-based materials that are formed by spin-on or inkjet-printing process. Another technique is evaporation, used exclusively for the so-called small-molecule OLEDs that do not use polymers. Evaporation technology is difficult to scale up, so polymer OLEDs (PLEDs) have become increasingly popular for mass production.

Figure 10:
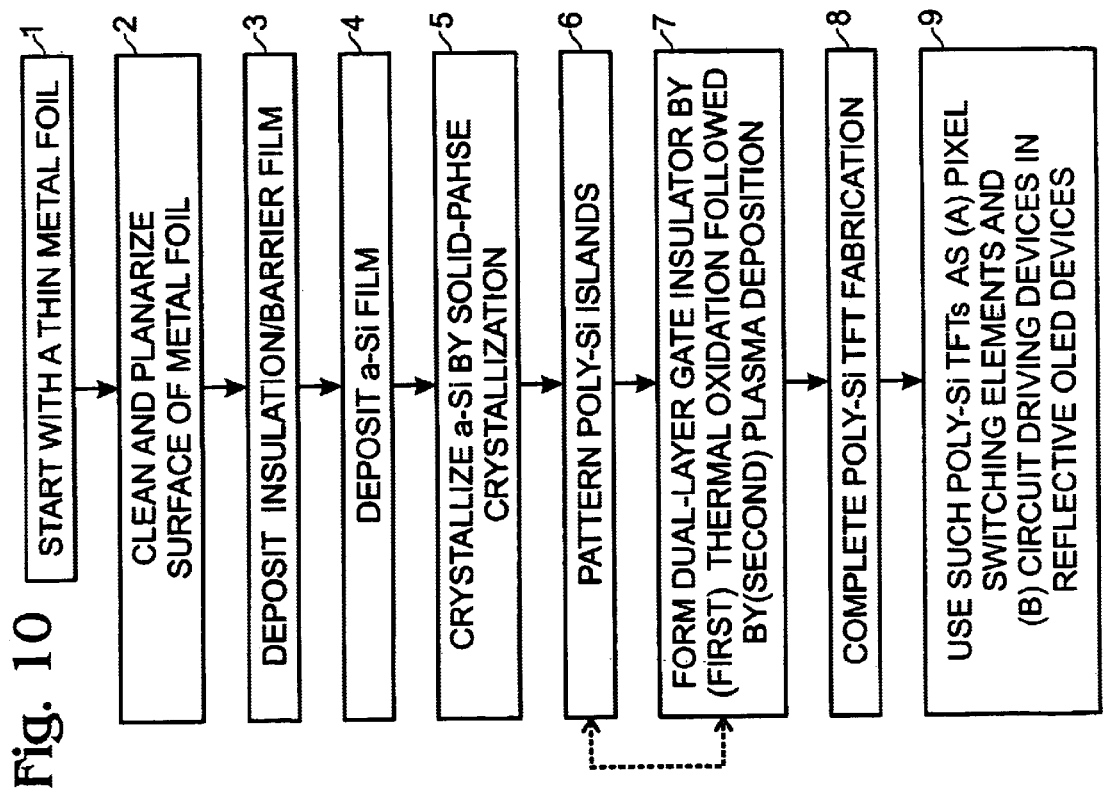
FIG. 10 is a flowchart illustrating the present invention general fabrication process.

FIG. 10 is a flowchart illustrating the present invention general fabrication process. The process is as follows:

1. Start with a metal foil substrate.

Metal foil material can be stainless steel, although other metal materials can be used such as Ti, Mo, etc.

Thickness of metal foil should be in the range of 10–500 $\mu$m (microns); preferably in the range of 50–250 $\mu$m; even more preferably in the range of 100–200 $\mu$m.

2. Clean and planarize the surface of the foil substrate. A number of different approaches can be used to accomplish surface planarization:

Use Chemical-Mechanical-Polishing (CMP) step to reduce the surface roughness of the metal foil substrate to better than 200 nm (average surface roughness).

Use a spin-coated dielectric material (i.e. Spin-on-glass, SOG) to form a uniform coating on top of the rough surface of the metal foil. The thickness of the SOG layer is in the range of 200–500 nm (nanometers).

3. Deposit an electrical isolation layer on the substrate. If the substrate has been planarized by CMP, this layer is deposited directly on the metal foil. If the substrate has been planarized by SOG, this layer is deposited on top of the SOG film.

The electrical isolation layer also serves as diffusion barrier against diffusion of impurities from the substrate to the device active layer(s) built in subsequent steps.

The isolation/barrier layer could be made of $SiO_2$ or $SiN_x$, SiON, or combination of these layers. The thickness of the isolation/barrier layer is in the range of 0.5–2.0 $\mu$m (preferably 0.5–1.5 $\mu$m, even more preferably 0.5–1 $\mu$m).

4. Deposit an amorphous silicon (a-Si) layer on top of the barrier/isolation layer.

The thickness of the a-Si layer should be in the range of 25–150 nm (preferably 25–100 nm, even more preferably 35-60 nm).

This layer could be in-situ doped or doped later with appropriate type and amount of dopant (i.e. Boron at ~5e13 at/cm$^2$) to impose a shift in the threshold voltage of the fabricated devices towards the desired direction (i.e. towards the positive direction).

5. Crystallize the a-Si layer to form poly-Si material.

Use standard solid-phase-crystallization method in a furnace or by Rapid-Thermal-Annealing (RTA). The temperature range for the phase transformation is 700–1000° C. (preferably 750–950° C.).

6. Pattern the poly-Si film to form poly-Si islands.

7. Form the gate-insulation (GI) film on top of the poly-Si islands. This step requires deposition of two types of GI layers. The first layer is formed by thermal oxidation. This layer forms the interface between the poly-Si active layer and the GI layer. High interface quality is desirable for good device characteristics. This high interface quality is achieved by the thermally-formed GI layer portion. The remaining GI layer is then formed by plasma deposition, i.e. using a TEOS-SiO2 process. The characteristics of this layer also affect the device performance, hence, the deposition process is geared towards producing a SiO2 film that has low density of fixed charges.

Thickness of first layer (thermal oxide): 10-50 nm (preferably 20-30 nm).

Thickness of second layer (plasma-deposited oxide): 40–100 nm (preferably 50–70 nm).

The sequence of steps 6 and 7 can be also reversed. Such reversal may be necessary, if (for example) the high temperature to which the foil is subjected during thermal oxidation causes significant shrinkage or expansion to the foil. If this happens after the film is initially patterned, subsequent patterns (i.e. lithography steps) may not be able to align to the first pattern (poly-Si islands) due to mis-registration problems (caused by the deformation of the substrate). If on the other hand, all lithography steps occur after the substrate is exposed to the highest temperature, such issues are avoided.

8. Complete the device fabrication using steps and processes that are conventional in the art.

9. Fabricate an OLED device apparatus using poly-Si TFTs made in the previous steps, as shown in FIG. 3.

Figure 11:
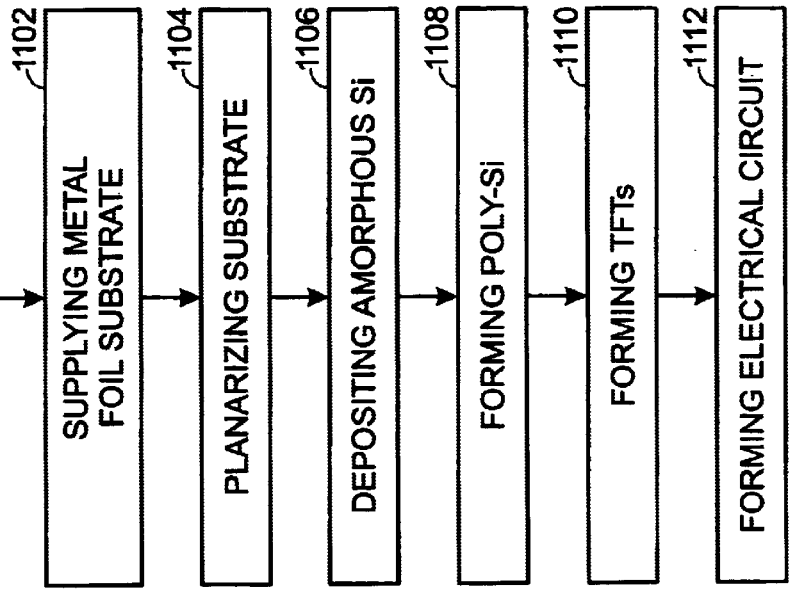
FIG. 11 is a flowchart illustrating the present invention method for forming an electronics circuit on a flexible substrate.

FIG. 11 is a flowchart illustrating the present invention method for forming an electronics circuit on a flexible substrate. Although the method (and the method depicted in FIG. 12) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1100.

Step 1100 supplies a metal foil substrate with a surface selected from the group including titanium (Ti), Inconel alloy, and Kovar. Step 1102 planarizes the metal foil substrate surface. Step 1104 deposits an electrical isolation layer overlying the planarized metal foil substrate surface. Step 1106 deposits amorphous silicon overlying the electrical insulation layer. Step 1108, from the amorphous silicon, forms polycrystalline silicon overlying the electrical insulation layer. Step 1110 forms thin-film transistors (TFTs) in the polycrystalline silicon. Step 1112 forms an electronic circuit using the TFTs. In some aspects, forming an electronics circuit in Step 1112 includes forming a organic light emitting diode (OLED) display.

In some aspects of the method, supplying a metal foil substrate with a surface in Step 1102 includes supplying a metal foil having a thickness in the range of 10 to 500 microns. Preferably, the metal foil has a thickness in the range of 50 to 250 microns. Most preferably, the metal foil has a thickness in the range of 100 to 200 microns.

In other aspects, depositing an electrical isolation layer overlying the planarized metal foil substrate surface in Step 1104 includes depositing a layer having a thickness in the range of 0.5 to 2 microns. Preferably, the electrical isolation layer has a thickness in the range of 0.5 to 1.5 microns. Most preferably, the electrical isolation layer has a thickness in the range of 0.5 to 1 microns.

In some aspects, depositing amorphous silicon in Step 1106 includes depositing amorphous silicon having a thickness in the range of 25 to 150 nm. Preferably, the amorphous silicon has a thickness in the range of 25 to 100 nm. Most preferably, the amorphous silicon has a thickness in the range of 35 to 60 nm.

Figure 12:
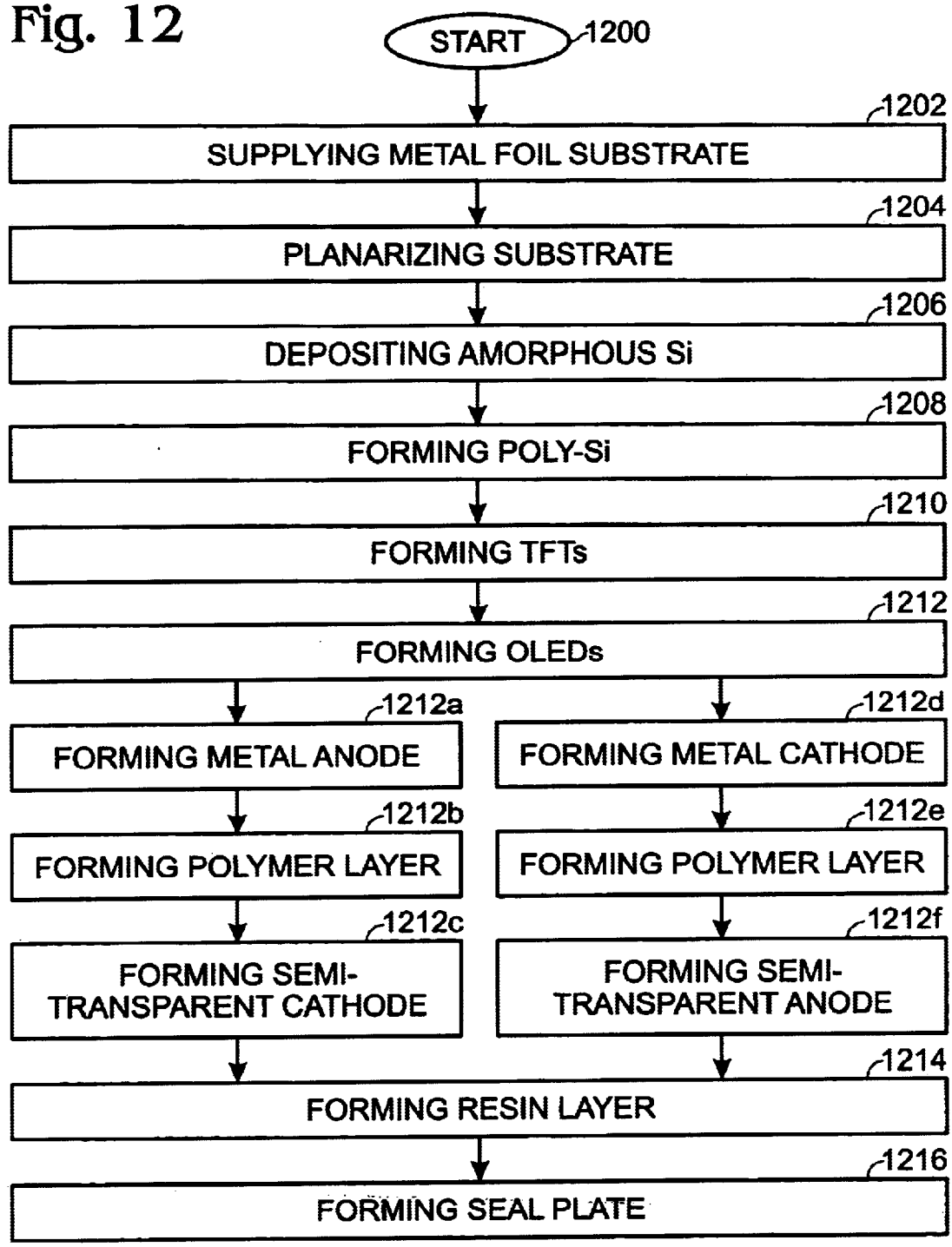
FIG. 12 is a flowchart illustrating the present invention method for forming an OLED display on a flexible substrate.

FIG. 12 is a flowchart illustrating the present invention method for forming an OLED display on a flexible substrate. The method starts at Step 1200. Step 1202 supplies a metal foil substrate with a surface selected from the group including titanium (Ti), Inconel alloy, and Kovar. Step 1204 deposits an electrical isolation layer overlying the planarized metal foil substrate surface. Step 1206 deposits amorphous silicon overlying the electrical insulation layer. Step 1208, from the amorphous silicon, forms polycrystalline silicon overlying the electrical insulation layer. Step 1210 forms thin-film transistors (TFTs) in the polycrystalline silicon. Step 1212 forming OLEDs overlying the TFTs. Step 1214 forms a resin layer overlying the OLEDs. Step 1216 forms a seal plate overlying the resin layer.

In some aspects of the method, supplying a metal foil substrate with a surface in Step 1202 includes supplying a metal foil having a thickness in the range of 10 to 500 microns. Preferably, the metal foil has a thickness in the range of 50 to 250 microns. Most preferably, the metal foil has a thickness in the range of 100 to 200 microns.

In other aspects, depositing an electrical isolation layer overlying the planarized metal foil substrate surface in Step 1204 includes depositing a layer having a thickness in the range of 0.5 to 2 microns. Preferably, the electrical isolation layer has a thickness in the range of 0.5 to 1.5 microns. Most preferably, the electrical isolation layer has a thickness in the range of 0.5 to 1 microns.

In some aspects, depositing amorphous silicon in Step 1206 includes depositing amorphous silicon having a thickness in the range of 25 to 150 nm. Preferably, the amorphous silicon has a thickness in the range of 25 to 100 nm. Most preferably, the amorphous silicon has a thickness in the range of 35 to 60 nm.

When the OLED cathode is grounded, forming OLEDs overlying the TFTs in Step 1212 includes substeps. Step 1212a forms a metal anode overlying the TFTs. Step 1212b forms a polymer organic layer overlying the anode. Step 1212c forms a semi-transparent cathode overlying the organic layer.

When the OLED anode is connected to a power line, forming OLEDs overlying the TFTs in Step 1212 includes alternate substeps. Step 1212d forms a metal cathode overlying the TFTs. Step 1212e forms a polymer organic layer overlying the cathode. Step 1212c forms a semitransparent anode overlying the organic layer.

A metal foil substrate OLED display and a fabrication method for same have been provided. Examples have been given as to how the display elements can be arranged in a pixel area, but the present invention is not limited to merely the depicted arrangements. Specific examples of one and two-TFT pixels have been shown, but the present invention is not limited to any particular number of TFTs per pixel. Likewise, process specifics have been given to demonstrate how such a display could be fabricated. However, many of these process steps could be replaced with other conventional processes. Although only top emission OLED displays have been described, the present invention concepts are also applicable to LCD displays, which also include pixel areas fabricated on a substrate. Other variations and embodiments of the invention will occur to those skilled in the art.

I claim:

1. A flexible substrate, active matrix (AM), top emission organic light-emitting diode (OLED) display comprising:
    a metal foil substrate;
    a first plurality of pixels areas, each pixel area including:
        at least one thin-film transistor (TFTs) overlying the substrate and connected to a data line; and,
        an OLED) overlying the TFT and connected to the TFT through a via; and,
    an SiO2 isolation layer, having a thickness of approximately 1 micron, interposed between the metal substrate and the pixels.

2. The OLED display of claim 1 wherein the metal foil substrate is selected from the group including titanium (Ti), Inconel alloy, stainless steel, and Kovar.

3. The OLED display of claim 1 wherein each pixel includes at least two TFTs connected to a gate line, a data line, and a power line.

4. The OLED display of claim 1 further comprising:
    a resin layer overlying the pixels; and,
    a seal plate overlying the resin layer.

5. The OLED display of claim 2 wherein the metal foil substrate has a thickness in the range of 10 to 500 microns.

6. The OLED display of claim 5 wherein the metal foil substrate has a thickness in the range of 50 to 250 microns.

7. The OLED display of claim 6 wherein the metal foil substrate has a thickness in the range of 100 to 200 microns.

8. The OLED display of claim 3 wherein each pixel includes:
    a first PMOS TFT having a drain electrode connected to the power line and a source electrode connected to an anode of the OLED;
    a second PMOS TFT having a source electrode connected to the data line, a drain electrode connected to the gate electrode of the first TFT, and a sate electrode connected to the gate line;
    wherein the OLED has a cathode connected to a ground; and,
    wherein the power line supplies a predetermined, constant voltage.

9. The OLED display of claim 8 wherein each pixel further includes a storage capacitor connected between the drain electrode of the second TFT and the gate electrode of the first TFT.

10. The OLED display of claim 8 wherein the power line is the metal foil substrate; and,
    wherein the drain of each pixel first TFT is connected to the substrate through a connection selected from the group including a single via and a plurality of vias.

11. The OLED display of claim 8 wherein the OLED anode is a metal anode overlying the first TFT and connected to the first TFT through a via; and,
    wherein the OLED further includes:
    an organic polymer layer overlying the metal anode; and,
    a semi-transparent cathode overlying the organic polymer layer.

12. The OLED display of claim 3 wherein each pixel includes:
    a first NMOS TFT having a drain electrode connected to a cathode of the OLED and a source electrode connected to a ground;
    a second NMOS TFT having a source electrode connected to the data line, a drain electrode connected to the gate electrode of the first TFT, and a date electrode connected to the gate line;
    wherein the OLED has an anode connected to the power line; and,
    wherein the power line supplies a predetermined, constant voltage.

13. The OLED display of claim 12 wherein each pixel further includes a storage capacitor connected between the drain electrode of the second TFT and the gate electrode of the first TFT.

14. The OLED display of claim 12 wherein the power line is the metal foil substrate; and,
    wherein the drain of each pixel first TFT is connected to the substrate through a connection selected from the group including a single via and a plurality of vias.

15. The OLED display of claim 12 wherein the OLED cathode is a metal cathode overlying the first TFT and connected to the first TFT through a via; and,
    wherein the OLED further includes:
    an organic polymer layer overlying the metal cathode; land,
    a semi-transparent anode overlying the organic polymer layer.

16. A flexible substrate, active matrix (AM), top emission organic light-emitting diode (OLED) display comprising:
    a metal foil substrate;
    a power line supplying a predetermined, constant voltage;
    a fist plurality of pixels areas, each pixel area including:
        a first PMOS TFT having a drain electrode connected to the power line and a source electrode;
        a second PMOS TFT having a source electrode connected to a data line, a drain electrode connected to a gate electrode of the first TFT, and agate electrode connected to a gate line;
        an OLED overlying the fret TFT, having an anode connected to the source electrode of the first TFT through a via, and a cathode connected to a ground.

17. The OLED display of claim 16 wherein each pixel further includes a storage capacitor connected between the drain electrode of the second TFT and the gate electrode of the first TFT.

18. The OLED display of claim 16 wherein the powerline is the metal foil substrate; and,
    wherein the drain of each pixel first TFT is connected to the substrate through a connection selected from the group including a single via and a plurality of vias.

19. The OLED display of claim 16 wherein the OLED anode is a metal anode overlying the first TFT and connected to the first TFT through a via; and,
    wherein the OLED further includes:
    an organic polymer layer overlying the metal anode; and,
    a semi-transparent cathode overlying the organic polymer layer.

20. A flexible substrate, active matrix (AM), top emission organic light-emitting diode (OLED) display comprising:
- a metal foil substrate;
- a power line supplying a predetermined, constant voltage;
- a first plurality of pixels areas, each pixel area including:
  - a first NMOS TFT having a drain electrode and a source electrode connected to a ground;
  - a second NMOS TFT having a source electrode connected to a data line, a dram electrode connected to a gate electrode of the first TFT, and a gate electrode connected to a gate line;
  - an OLED overlying the first TFT, having a cathode connected to the drain electrode of the first TFT through a via, arid an anode connected to the power line.

21. The OLED display of claim 20 wherein each pixel further includes a storage capacitor connected between the drain electrode of the second TFT and the gate electrode of the first TFT.

22. The OLED display of claim 20 wherein the power line is the metal foil substrate; and,
  - wherein the drain of each pixel first TFT is connected to the substrate through a connection selected from the group including a single via and a plurality of vias.

23. The OLED display of claim 20 wherein the OLED cathode is a metal cathode overlying the first TFT and connected to the first TFT through a via; and,
  - wherein the OLED further includes:
    - an organic polymer layer overlying the metal cathode; and,
    - a semi-transparent anode overlying the organic polymer layer.

24. A flexible substrate, active matrix (AM), top emission organic light-emitting diode (OLED) display comprising:
- a metal foil substrate;
- a first plurality of pixels areas, each pixel area including:
  - at least one thin-film transistor (TFTs) overlying the substrate and connected to a data line; and,
  - an OLED overlying the TFT and connected to the TFT through a via;
- a resin layer overlying the pixels; and,
- a seal plate overlying the resin layer.

* * * * *